United States Patent [19]
Futatsugi et al.

[11] Patent Number: 5,621,746
[45] Date of Patent: Apr. 15, 1997

[54] SEMICONDUCTOR LASER AND METHOD OF MANUFACTURING SAME

[75] Inventors: Makoto Futatsugi, Kanagawa; Katsumi Ando, Tokyo; Tadashi Yamamoto, Kanagawa, all of Japan

[73] Assignee: Sony Corporation, Tokyo, Japan

[21] Appl. No.: 135,965

[22] Filed: Oct. 14, 1993

[30] Foreign Application Priority Data

Oct. 14, 1992 [JP] Japan ................................. 4-276213
Sep. 17, 1993 [JP] Japan ................................. 5-231864

[51] Int. Cl.$^6$ ..................................... H01S 3/19
[52] U.S. Cl. ..................... 372/45; 372/43; 372/48; 438/33; 438/42; 438/964
[58] Field of Search ................... 372/48, 45, 46, 372/50, 43; 437/129, 226

[56] References Cited

U.S. PATENT DOCUMENTS

| | | | |
|---|---|---|---|
| 4,236,296 | 12/1980 | Woolhouse et al. | 437/226 |
| 4,237,601 | 12/1980 | Woolhouse et al. | 437/226 |
| 4,742,506 | 5/1988 | Fukumoto et al. | 369/112 |
| 4,779,280 | 10/1988 | Sermage et al. | 372/45 |
| 4,797,890 | 1/1989 | Inaba et al. | 372/46 |
| 4,888,760 | 12/1989 | Shikama et al. | 369/112 |
| 5,020,066 | 5/1991 | Iga et al. | 372/45 |
| 5,392,304 | 2/1995 | Tanaka et al. | 372/46 |
| 5,396,481 | 3/1995 | Uchida | 372/43 |

FOREIGN PATENT DOCUMENTS

| | | | |
|---|---|---|---|
| 62-104093 | 5/1987 | Japan | 372/43 |
| 63-177492 | 7/1988 | Japan | 372/43 |
| 63-265483 | 11/1988 | Japan | 372/43 |
| 63-208293 | 12/1988 | Japan . | |
| 63-250186 | 2/1989 | Japan . | |
| 02035788 | 4/1990 | Japan . | |
| 02084786 | 6/1990 | Japan . | |
| 02199889 | 10/1990 | Japan . | |
| 04230024 | 12/1992 | Japan . | |

*Primary Examiner*—Rodney B. Bovernick
*Assistant Examiner*—Yisun Song
*Attorney, Agent, or Firm*—Hill, Steadman & Simpson

[57] ABSTRACT

A semiconductor laser such as a laser diode includes a semiconductor substrate and a laser diode region disposed on said semiconductor substrate and having a laser beam emission end. The semiconductor substrate has a front surface directly below said laser beam emission end, said front surface being retracted from said laser beam emission end. The front surface may be formed as an optically roughened surface as a side wall surface of a groove when the groove is defined in the semiconductor substrate by dicing. The laser diode region includes an active layer of GaAs or AlGaAs. The front surface may further be optically roughened by etching or sputtering.

14 Claims, 4 Drawing Sheets

SEMICONDUCTOR LASER AND METHOD OF MANUFACTURING SAME

BACKGROUND OF THE INVENTION

1. Field of the Invention

The present invention relates to a semiconductor laser such as a laser diode and a method of manufacturing such a semiconductor laser, and more particularly to a semiconductor laser suitable for use as a light source in an optical system such as an optical pickup for reading information recorded on a magnetooptical disk or the like and a method of manufacturing such a semiconductor laser.

2. Description of the Prior Art

Optical systems such as optical pickups for reading information recorded on a magnetooptical disk or the like incorporate a semiconductor laser such as a laser diode as a light source. Generally, the semiconductor lasers have a mirror surface formed in a cleavage plane. It is known in the art that light returning from the optical system combined with a semiconductor laser is reflected by a front end surface of the mirror surface and reenters the optical system, causing a variety of noise-induced problems. If the reentry of light from the optical system into the semiconductor laser occurs in a three-spot optical disk pickup, then tracking control is adversely affected.

In order to alleviate the above drawback, it has been proposed to reduce the thickness of the pellet itself of the semiconductor laser for thereby allowing as much of the reentrant light from the optical system as possible to pass behind the semiconductor laser pellet.

However, since a wafer from which semiconductor laser pellets are cut out is also reduced in thickness, the mechanical strength of the wafer is lowered. While semiconductor lasers are being fabricated, they have to be handled with utmost care as they tend to be easily damaged. Therefore, the fabrication process is low in efficiency and suffers a high rate of defective semiconductor lasers in the yield.

According to another proposal, the front end surface of the mirror surface of the semiconductor laser, except for a laser emission area, is coated with a material having a low reflectance or a material having a high absorptance. The process of coating such a material is, however, practically complex and difficult to carry out.

OBJECTS AND SUMMARY OF THE INVENTION

It is an object of the present invention to provide a semiconductor laser which capable of effectively preventing light from returning from an optical system to the semiconductor laser, and which can be manufactured and handled with ease and is prevented from damage during fabrication, and a method of manufacturing such a semiconductor laser.

According to the present invention, there is provided a semiconductor laser comprising a semiconductor substrate, and a laser diode region disposed on the semiconductor substrate and having a laser beam emission end, the semiconductor substrate having a front surface directly below the laser beam emission end, the front surface being retracted from the laser beam emission end.

The front surface may comprise an optically roughened surface. The laser diode region may include an active layer of GaAs or AlGaAs.

The front surface may be formed as a side wall surface of a groove which is defined in the semiconductor substrate by dicing, whereby the front surface is retracted from the laser beam emission end and formed as the optically roughened surface upon dicing.

According to the present invention, there is also provided a semiconductor laser comprising a semiconductor substrate, and a laser diode region disposed on the semiconductor substrate and having a laser beam emission end, the semiconductor substrate having a pair of front surfaces directly above and below the laser beam emission end, the front surfaces being retracted from the laser beam emission end.

The front surfaces may comprise respective optically roughened surfaces, and the laser diode region may include an active layer of GaAs or AlGaAs.

The front surfaces may be formed as side wall surfaces of respective grooves which are defined in the semiconductor substrate and the laser diode region, respectively, by dicing, whereby the front surfaces are retracted from the laser beam emission end and formed as the optically roughened surfaces upon dicing.

According to the present invention, there is further provided a method of manufacturing a semiconductor laser, comprising the steps of depositing a laser diode region on a semiconductor substrate, the laser diode region having a laser beam emission region, defining a groove in the semiconductor substrate by dicing, the groove having a side wall surface as a front surface which is retracted from the laser beam emission end and formed as an optically roughened surface, and etching the side wall surface to further optically roughen the front surface by way of wet etching, for example.

According to the present invention, there is also provided a method of manufacturing a semiconductor laser, comprising the steps of depositing a laser diode region on a semiconductor substrate, the laser diode region having a laser beam emission region, defining a pair of groove in the semiconductor substrate and the laser diode region by dicing, the grooves having respective side wall surfaces as front surfaces which are retracted from the laser beam emission end and formed as optically roughened surfaces, respectively, and etching the side wall surfaces to further optically roughen the front surfaces by way of wet etching, for example.

According to the present invention, there is further provided a method of manufacturing a semiconductor laser, comprising the steps of depositing a laser diode region on a semiconductor substrate, the laser diode region having a laser beam emission region, defining a groove in the semiconductor substrate by dicing, the groove having a side wall surface as a front surface which is retracted from the laser beam emission end and formed as an optically roughened surface, and sputtering the side wall surface to further optically roughen the front surface by way of argon sputtering, for example.

According to the present invention, there is also provided a method of manufacturing a semiconductor laser, comprising the steps of depositing a laser diode region on a semiconductor substrate, the laser diode region having a laser beam emission region, defining a pair of groove in the semiconductor substrate and the laser diode region by dicing, the grooves having respective side wall surfaces as front surfaces which are retracted from the laser beam emission end and formed as optically roughened surfaces, respectively, and sputtering the side wall surfaces to further optically roughen the front surfaces by way of argon sputtering, for example.

When the semiconductor laser according to the present invention is used as a light source in an optical pickup for recording information on and reproducing information from an optical disk or the like, the retracted and roughened front surface or surfaces are effective to reduce reentrant light reflected from the semiconductor laser to the optical system of the optical pickup.

Specifically, the retracted and roughened front surface or surfaces reflect returning light from the optical system away from the optical system. As any reentrant light reflected back to the optical system is greatly reduced, any tracking error occurring in the tracking control based on signals produced by the optical pickup is reduced, and a C/N (carrier-to-noise ratio) of signals produced by the optical pickup is improved.

When the front surface or surfaces are formed by dicing, the front surface or surfaces are retracted and optically roughened simultaneously. Consequently, the process of manufacturing the semiconductor laser is simplified.

Inasmuch as only the front surface or surfaces are retracted from the laser beam emission end after the laser diode region is formed, the semiconductor laser is made thin partially and remains mechanically strong enough during formation of the laser diode region. Therefore, while the semiconductor laser is being fabricated, it is prevented from damage and is not required to be handled with utmost care. The rate of defective semiconductor lasers in the yield is rendered relative low.

The above and other objects, features, and advantages of the present invention will become apparent from the following description of illustrative embodiments thereof to be read in conjunction with the accompanying drawings, in which like reference numerals represent the same or similar objects.

DETAILED DESCRIPTION OF THE PREFERRED EMBODIMENTS

Figure 3:
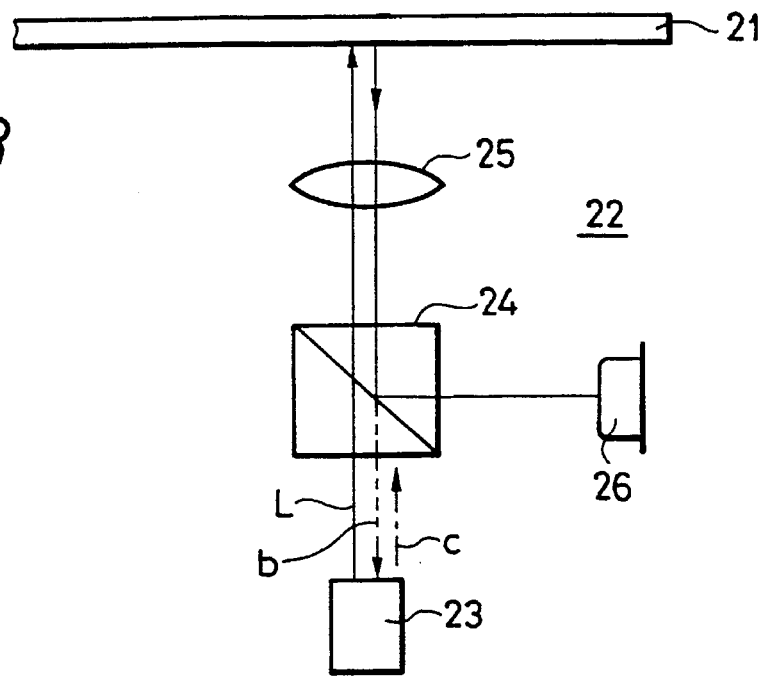
FIG. 3 is a schematic view of an optical pickup which can incorporate a semiconductor laser according to the present invention.

The principles of the present invention are particularly useful when embodied in a semiconductor laser such as a laser diode for use as a light source 23 in an optical pickup 22 as shown in FIG. 3. The optical pickup 22 is used to record information on and reproduce information from an optical disk 21, for example.

When the optical pickup 22 operates in a reproducing mode, a laser beam L emitted from the semiconductor laser of the light source 23 travels through a beamsplitter 24 and an objective 25, and is focused onto an information-recorded surface of the optical disk 21. A portion of light reflected from the information-recorded surface of the optical disk 21 and bearing the recorded information is reflected by the beamsplitter 24 and detected by a light detector 26. The remaining reflected light passes through the beamsplitter 24, and returns to the light source 23 as indicated by the broken line b in FIG. 3. When the light that has returned to the light source 23 is reflected by a front end surface of the semiconductor laser of the light source 23, it reenters the optical system of the optical pickup 22 as indicated by the broken line c in FIG. 3.

According to the present invention, the semiconductor laser is arranged to reduce the reentrant light c reflected thereby toward the optical system.

The optical disk 21 may record desired information in the form of pits burned in the surface thereof or may magnetooptically record desired information. The optical pickup 23, which is only schematically shown in FIG. 3, may be of any of various known structures for reproducing the recorded information through optical interference caused by the pits or by way of the magnetooptical effect.

Of course, the semiconductor laser of the light source 23 can be used to emit a laser beam to record desired information on the optical disk 21 when the optical pickup 22 operates in a recording mode.

A process of manufacturing a semiconductor laser for use as the light source 23 in FIG. 3 according to the present invention will be described below with reference to FIGS. 2A and 2B.

Figure 2A:
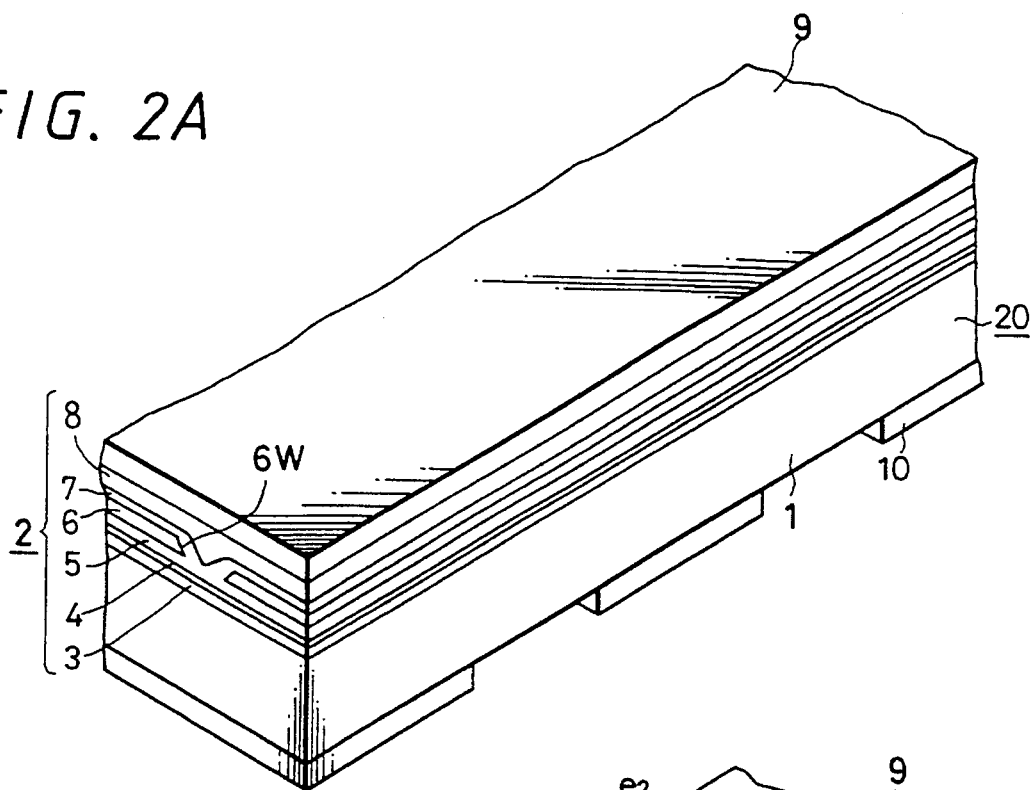
FIG. 2A and 2B are fragmentary perspective views illustrative of a process of manufacturing a semiconductor laser according to the present invention.

As shown in FIG. 2A, a laser diode region 2 is formed by way of epitaxial growth on an n-type semiconductor substrate 1 which may be made of GaAs, for example, which may have a thickness of 400 μm, for example. The thickness of the semiconductor substrate 1 may range from 100 μm to 150 μm or further up to 500 μm.

The laser diode region 2 is fabricated as follows: First, an n-type buffer layer (not shown), if necessary, is deposited on the semiconductor substrate 1. Then, an n-type first cladding layer 3 which may be made of AlGaAs, for example, an active layer 4 which may be made of GaAs, for example, a p-type second cladding layer 5 which may be made of AlGaAs, for example, and an n-type current constricting layer 6 are successively deposited on the buffer layer by epitaxial growth. Thereafter, a portion of the current constricting layer 6 is etched away to form a stripe-shaped recess 6W. Then, a p-type third cladding layer 7 which may be made of AlGaAs, for example, is deposited on the current constricting layer 6 including the stripe-shaped recess 6W by epitaxial growth, after which a p-type cap layer 8 which may be made of GaAs, for example, is deposited on the third cladding layer 7 by epitaxial growth.

The semiconductor substrate 1 and the laser diode region 2 formed thereon jointly serve as a wafer 20.

An electrode 9 is then joined to the entire surface of the cap layer 8 by way of ohmic contact. Another electrode 10 is also joined to the reverse surface of the semiconductor substrate 1 except for a diced area (described later on), by way of ohmic contact.

Figure 2B:
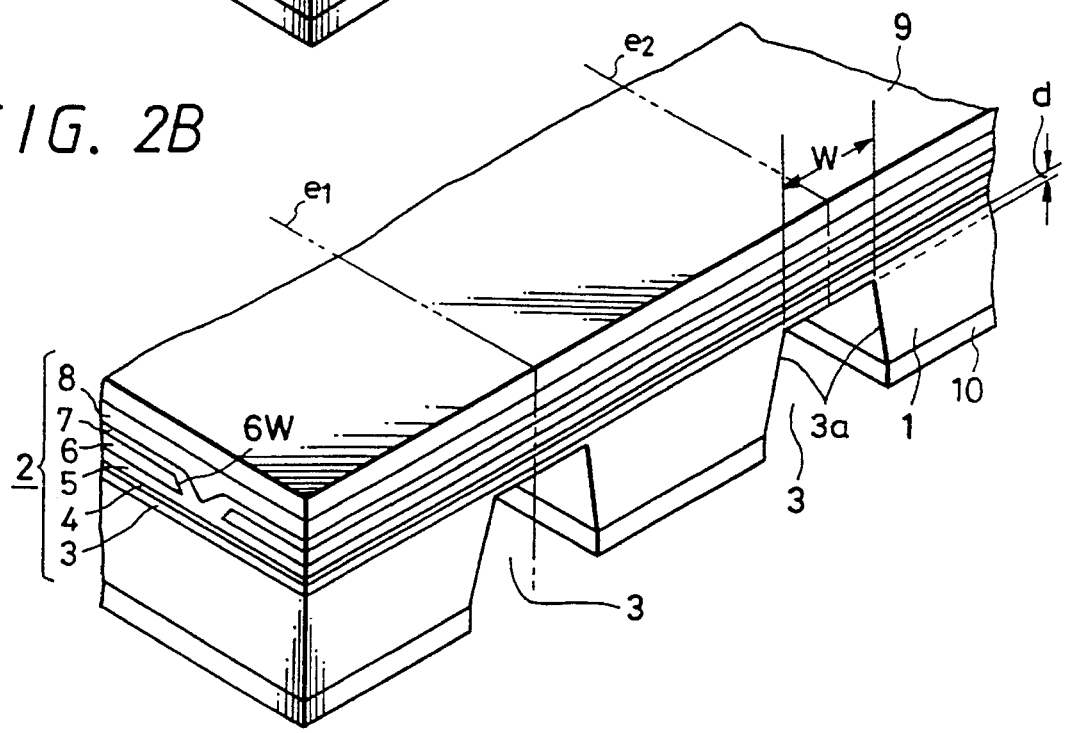

Subsequently, as shown in FIG. 2B, grooves 3 are cut into the semiconductor substrate 1 through the electrode 10 by a dicing machine, leaving a thickness d of the semiconductor substrate 1. The grooves 3 have respective axes extending transversely to the direction in which the stripe-shaped recess 6W extends.

Each of the grooves 3 has a bottom whose width W which may be of 40 μm, for example. The thickness d may be of 60 μm, for example. Each of the grooves 3 has a pair of opposite side wall surfaces 3a which should preferably be respective slanted surfaces flaring away from each other toward the opening of the groove, but may have parallel vertical surfaces.

The side wall surfaces 3a of the grooves 3 that are defined by dicing comprise optically rough surfaces for diffusing light applied thereto, rather than mirror surfaces.

Thereafter, the wafer is cut off, i.e., pelletized into desired semiconductor lasers, along lines transverse to the grooves 3 and lines along the grooves 3 parallel to the cleavage plane of the crystal, as indicated by two-dot-and-dash lines $e_1$, $e_2$ in FIG. 2B.

Figure 1:
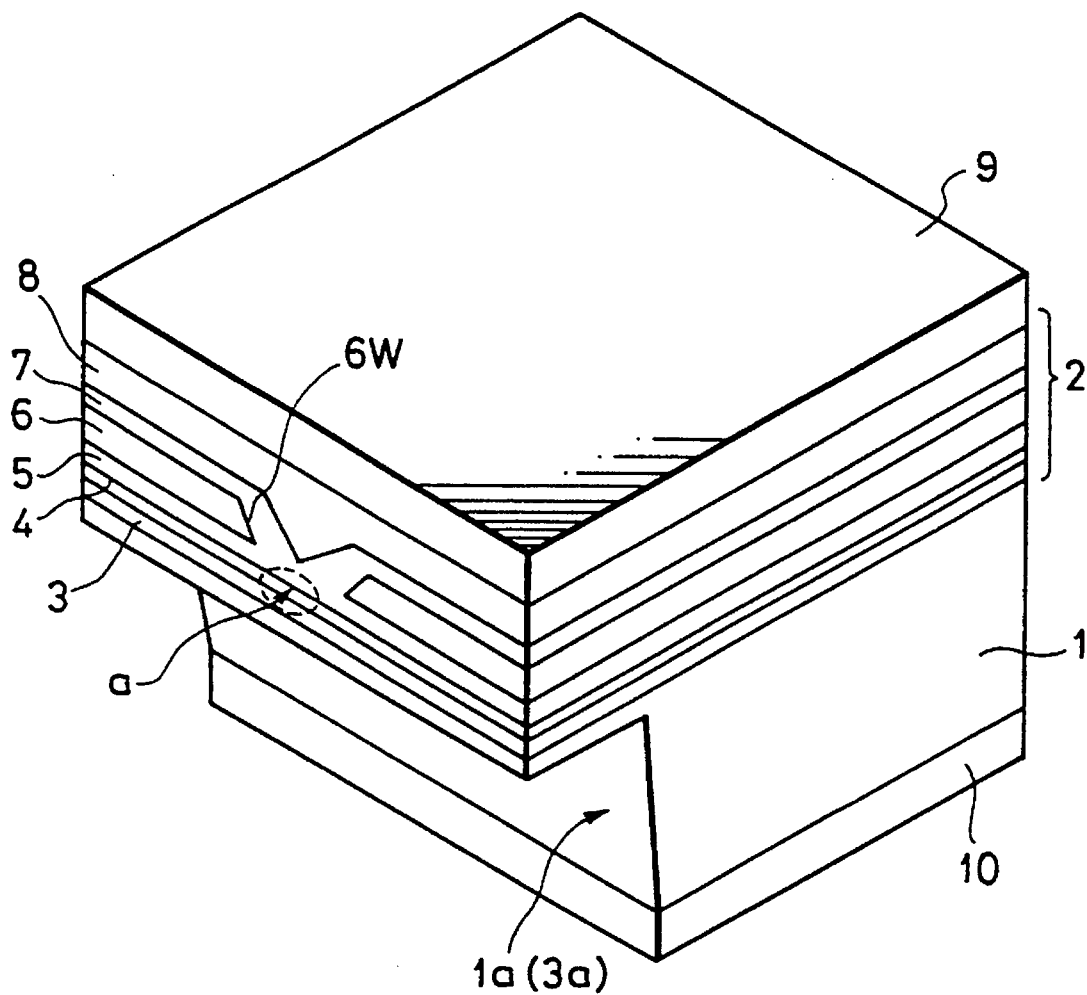
FIG. 1 is an enlarged perspective view of a semiconductor laser according to an embodiment of the present invention.

In this manner, a semiconductor laser with the laser diode region 2 disposed on the semiconductor substrate 1 as shown in FIG. 1 is fabricated.

The semiconductor laser thus fabricated has one of the side wall surfaces 3a of the groove 3, i.e., an optically roughened surface, as a front end surface 1a on the semiconductor substrate 1.

When a forward-biased voltage is applied between the electrodes 9, 10, a current is concentrated on the stripe-shaped recess 6W of the current constricting layer 6, and injected into a portion of the active layer 4 thereby to give rise laser oscillation. Therefore, a laser beam is emitted from a laser beam emission end a on the cleavage plane.

The front end surface 1a of the semiconductor substrate 1, directly below the laser beam emission end a, is sufficiently retracted from the laser beam emission end a.

As described above, the front end surface 1a is retracted from the laser beam emission end a, and is an optically roughened surface for diffusing applied light. By suitably selecting the angle of inclination of the front end surface 1a, even though the light b (see FIG. 3) returns from the optical system to the semiconductor laser of the light source 23, any reentrant light reflected from the front end surface 1a toward the optical system can be greatly reduced.

Figure 4:
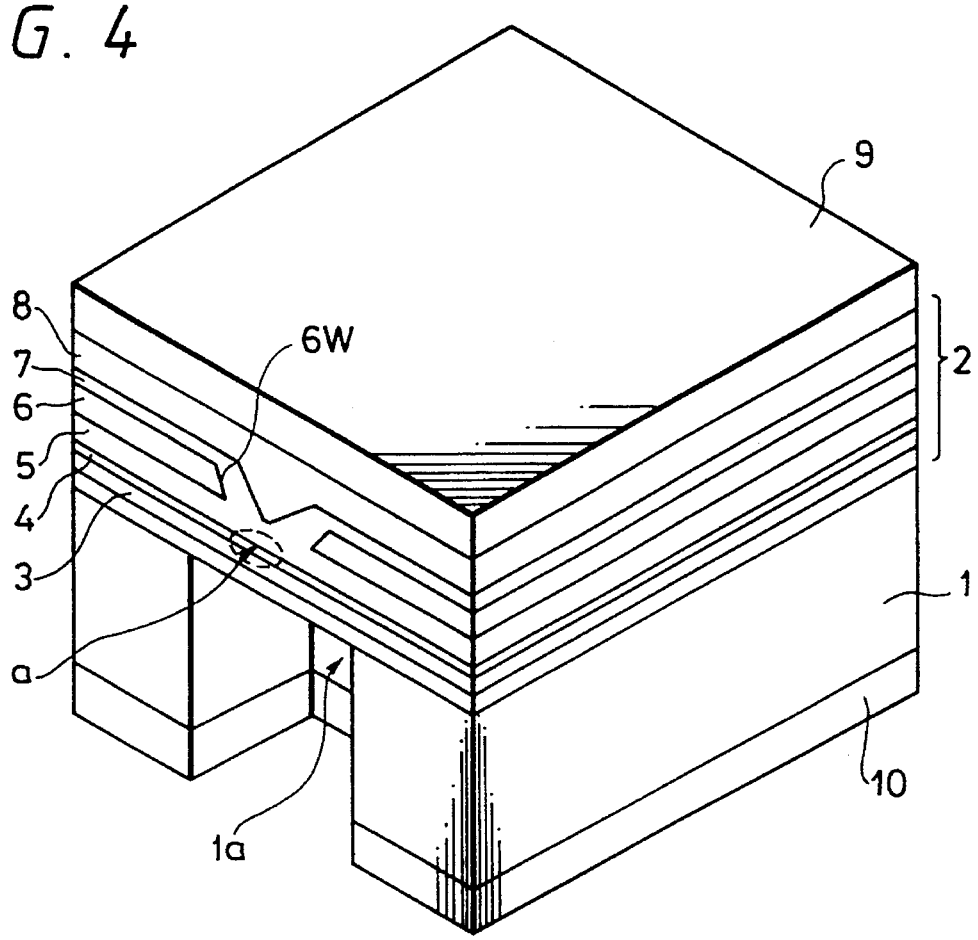
FIG. 4 is an enlarged perspective view of a semiconductor laser according to another embodiment of the present invention.

FIG. 4 shows a semiconductor laser according to another embodiment of the present invention. In FIG. 4, only a limited partial front surface 1a where the reentry of light from the semiconductor laser to the optical system would be problematic is retracted from the laser beam emission end a as a cavity directly below the laser beam emission end a and between other front end surfaces of the semiconductor substrate 1.

Figure 5:
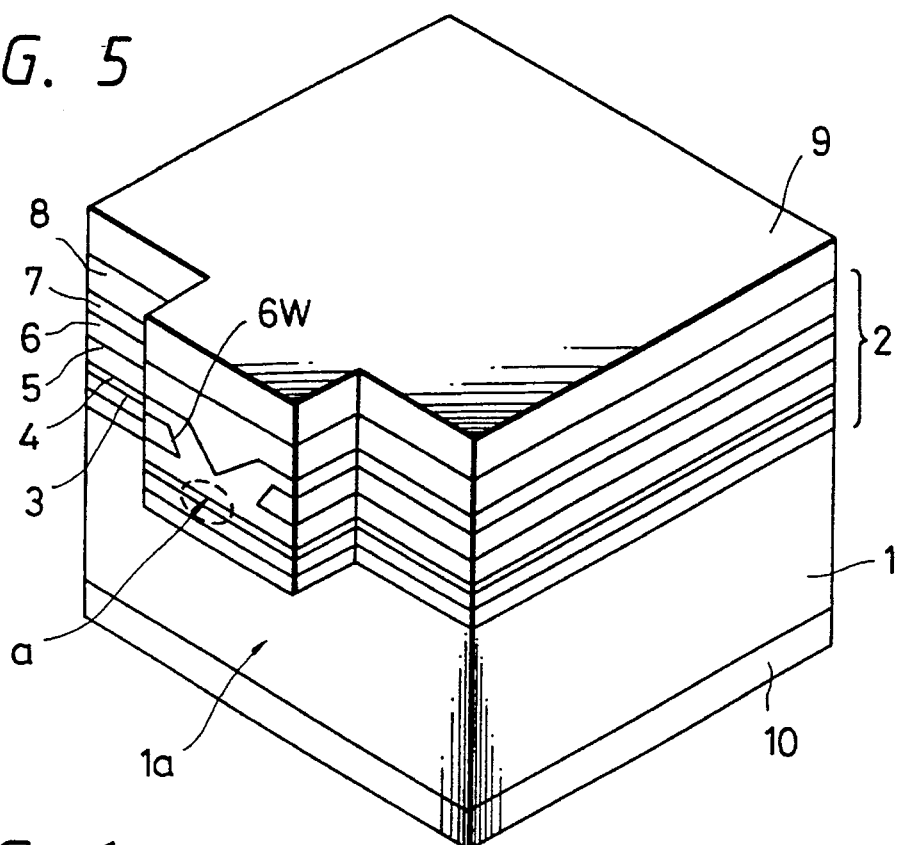
FIG. 5 is an enlarged perspective view of a semiconductor laser according to still another embodiment of the present invention.

According to still another embodiment of the present invention shown in FIG. 5, the front end surface 1a of the semiconductor substrate 1 and also limited partial front end surfaces of the laser diode region 2 are retracted from the laser beam emission end a that is positioned between the partial front end surfaces of the laser diode region 2.

Figure 6:
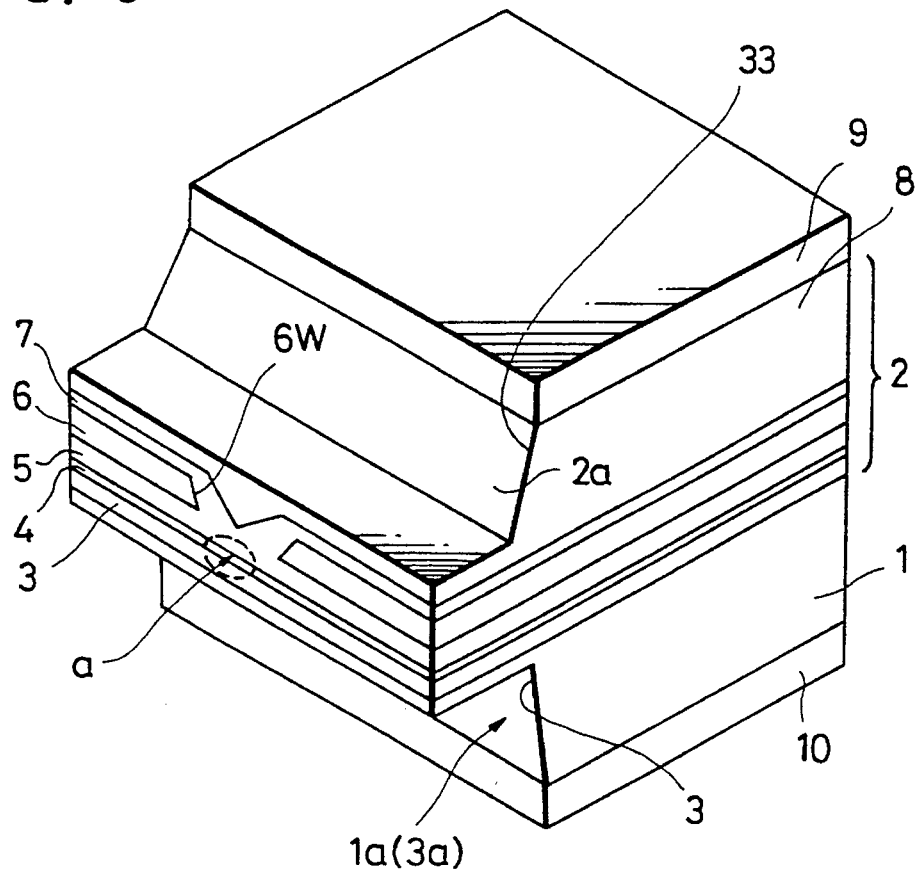
FIG. 6 is an enlarged perspective view of a semiconductor laser according to yet another embodiment of the present invention.

FIG. 6 shows a semiconductor laser according to yet another embodiment of the present invention. In FIG. 6, the p-type cap layer 8 has an increased thickness such that the laser beam emission end a is positioned substantially centrally across the overall thickness of the semiconductor laser. A stripe-shaped groove 33 is defined in the cap layer 8 at the front end of the laser diode region 2 parallel to and aligned with the stripe-shaped groove 3 that is defined in the semiconductor substrate 1. The stripe-shaped groove 33 has a side wall surface as a front end surface 2a of the cap layer 8, which is located directly above and retracted from the laser beam emission end a to prevent light from being reflected and reentering the optical system.

In the above embodiments, the grooves 3, 33 are defined by dicing with the side wall surfaces 3a formed as optically roughened surfaces upon dicing. However, the grooves 3, 33 may be defined by chemical or mechanochemical etching with the side wall surfaces 3a formed as optically roughened surfaces upon chemical or mechanochemical etching.

Alternatively, after the grooves 3, 33 are defined by dicing, the side wall surfaces 3a may be formed as optically roughened surfaces by etching, sputtering, or the like.

More specifically, in FIG. 2B, the side wall surfaces 3a of GaAs may be formed as optically roughened surfaces by an wet etching process with a sulfuric acid etchant under the conditions given in Table 1 below:

TABLE 1

| | $H_2SO_4$ aq. (96 wt %) | $H_2O_2$ aq. (98 wt %) | $H_2O$ |
|---|---|---|---|
| Volume ratio | 1 | 10 | 10 |
| Etching time: 1 minute | | | |
| Etching temperature: Room temperature | | | |

If the side wall surfaces 3a formed as optically roughened surfaces upon sputtering, then an argon (Ar) gas should preferably be used under the sputtering conditions given in Table 2 below:

Table 2

System: Cathode-coupled parallel flat plate RIE system

Ar gas: 30~50 sccm

Pressure: 0.5 Pa

RF power: 0.2 W/cm² (13.56 MHz)

Substrate bias: 300 V

Temperature: Room temperature

Time: 2 minutes

In the illustrated embodiments, the laser diode region 2 is of a double-hetero junction. However, the principles of the present invention are also applicable to any of various other laser diode structures.

As described above, since at least the front end surface 1a of the semiconductor substrate 1 directly below the laser beam emission end a is retracted from the laser beam emission end a, it is possible to reduce reentrant light into the optical system that is reflected by the front surface of the semiconductor substrate 1 which confronts the optical system. In the case where the front end surface 1a is an optically roughened surface, it diffuses light applied thereto. In the case where the front end surface 1a is slanted, it is effective to reduce reentrant light into the optical system as it reflects light away from the optical system.

Inasmuch as the recesses 3 are defined partially in the semiconductor substrate 1 after the laser diode region 2 and the electrodes 9, 10 are formed, the semiconductor laser is mechanically strong enough to avoid damage during formation of the laser diode region 2 and the electrodes 9, 10. Because the mechanically strong semiconductor laser is not required to be handled with utmost care while the laser diode region 2 and the electrodes 9, 10 are being formed, the efficiency of fabrication and the rate of defective semiconductor lasers in the yield are prevented from being lowered.

When the grooves 3 are defined by dicing, the front surface 1a is retracted and roughened simultaneously with dicing. Therefore, the semiconductor lasers can be mass-produced at a high production rate.

Having described preferred embodiments of the invention with reference to the accompanying drawings, it is to be understood that the invention is not limited to those precise embodiments and that various changes and modifications could be effected by one skilled in the art without departing from the spirit or scope of the invention as defined in the appended claims.

What is claimed is:

1. A semiconductor laser, comprising:

a semiconductor substrate;

a laser diode region disposed on said semiconductor substrate and having a laser beam emission end; and said semiconductor substrate having a front surface directly below said laser beam emission end, said front surface being stepped back from said end so as to be retracted from said laser beam emission end, wherein said front surface comprises an optically roughened surface, wherein said front surface is formed as a side wall surface of a groove which is defined in said semiconductor substrate by dicing, whereby said front surface is retracted from said laser beam emission end and formed as said optically roughened surface upon dicing.

2. In manufacturing a semiconductor laser a method, comprising the steps of:

depositing a laser diode region on a semiconductor substrate, said laser diode region having a laser beam emission region;

defining a groove in said semiconductor substrate by dicing, said groove having a side wall surface as a front surface which is retracted from said laser beam emission end and formed as an optically roughened surface; and etching said side wall surface to further optically roughen said front surface.

3. A method according to claim 2, wherein said side wall surface is etched by wet etching.

4. In manufacturing a semiconductor laser a method, comprising the steps of:

depositing a laser diode region on a semiconductor substrate, said laser diode region having a laser beam emission region;

defining a pair of groove in said semiconductor substrate and said laser diode region by dicing, said grooves having respective side wall surfaces as front surfaces which are retracted from said laser beam emission end and formed as optically roughened surfaces, respectively; and etching said side wall surfaces to further optically roughen said front surfaces.

5. A method according to claim 4, wherein said side wall surfaces are etched by wet etching.

6. In manufacturing a semiconductor laser a method, comprising the steps of:

depositing a laser diode region on a semiconductor substrate, said laser diode region having a laser beam emission region;

defining a groove in said semiconductor substrate by dicing, said groove having a side wall surface as a front surface which is retracted from said laser beam emission end and formed as an optically roughened surface; and sputtering said side wall surface to further optically roughen said front surface.

7. A method according to claim 6, wherein said side wall surface is sputtered by argon sputtering.

8. In manufacturing a semiconductor laser a method, comprising the steps of:

depositing a laser diode region on a semiconductor substrate, said laser diode region having a laser beam emission region;

defining a pair of groove in said semiconductor substrate and said laser diode region by dicing, said grooves having respective side wall surfaces as front surfaces which are retracted from said laser beam emission end and formed as optically roughened surfaces, respectively; and sputtering said side wall surfaces to further optically roughen said front surfaces.

9. A method according to claim 8, wherein said side wall surfaces are sputtered by argon sputtering.

10. A semiconductor laser, comprising a semiconductor substrate having a first surface and a second surface which is opposite to the first surface;

a laser diode region disposed on the first surface of the semiconductor substrate and comprising an active layer for emitting a laser beam, and first and second cladding layers which sandwich the active layer to form a laser beam emission end in a face surface of the laser diode region;

a first electrode formed over the first surface of the semiconductor substrate;

a second electrode formed on the second surface of the semiconductor substrate; and said semiconductor substrate having a front surface below the laser beam emission end, said front surface being stepped back from said end so as to be retracted from the laser beam emission end, wherein said front surface comprises an optically roughened surface, wherein said laser diode region has a front surface above the laser beam emission end, said front surface being retracted from the laser beam emission end.

11. In a semiconductor laser, the combination comprising:

a semiconductor substrate;

a laser diode region disposed on said semiconductor substrate and having a laser beam emission end;

a cap layer overlying said laser diode region; and said semiconductor substrate and said cap layer each having a front surface directly above and below said laser beam emission end, said front surfaces being retracted from said laser beam emission end, wherein said front surfaces comprise respective optically roughened surfaces.

12. A semiconductor laser according to claim 11, wherein said laser diode region includes an active layer of GaAs or AlGaAs.

13. A semiconductor laser according to claim 11, wherein said laser diode region includes an active layer of GaAs or AlGaAs.

14. A semiconductor laser according to claim 11, wherein said front surfaces are formed as side wall surfaces of respective grooves which are defined in said semiconductor substrate and said laser diode region, respectively, by dicing, whereby said front surfaces are retracted from said laser beam emission end and formed as said optically roughened surfaces upon dicing.

* * * * *